(12) United States Patent
Derkacs

(10) Patent No.: US 10,559,705 B1
(45) Date of Patent: Feb. 11, 2020

(54) MULTIJUNCTION SOLAR CELLS HAVING A GRADED-INDEX REFLECTOR STRUCTURE

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 16/167,110

(22) Filed: Oct. 22, 2018

Related U.S. Application Data

(63) Continuation of application No. 15/495,524, filed on Apr. 24, 2017, now abandoned.

(60) Provisional application No. 62/391,752, filed on May 11, 2016.

(51) Int. Cl.
*H01L 31/054* (2014.01)
*H01L 31/0687* (2012.01)

(52) U.S. Cl.
CPC ...... *H01L 31/0547* (2014.12); *H01L 31/0687* (2013.01); *H01L 31/06875* (2013.01)

(58) Field of Classification Search
CPC ..... H01L 31/00; H01L 31/02; H01L 31/0232; H01L 31/02327; H01L 31/0687; H01L 31/06875; H01L 31/054; H01L 31/0549
See application file for complete search history.

(56) References Cited

U.S. PATENT DOCUMENTS

| | | | | |
|---|---|---|---|---|
| 5,170,407 A | * | 12/1992 | Schubert | ............. H01S 5/18361 |
| | | | | 372/96 |
| 2008/0163920 A1 | * | 7/2008 | Meusel | ............. H01L 31/02168 |
| | | | | 136/246 |
| 2010/0147366 A1 | * | 6/2010 | Stan | .................. H01L 31/06875 |
| | | | | 136/255 |

* cited by examiner

*Primary Examiner* — Christina Chern

(57) ABSTRACT

A multijunction solar cells that include one or more graded-index reflector structures disposed beneath a base layer of one or more solar subcells. The graded-index reflector structure is constructed such that (i) at least a portion of light of a first spectral wavelength range that enters and passes through a solar cell above the graded-index reflector structure is reflected back into the solar subcell by the graded-index reflector structure; and (ii) at least a portion of light of a second spectral wavelength range that enters and passes through the solar cell above the graded-index reflector structure is transmitted through the graded-index reflector structure to layers disposed beneath the graded-index reflector structure. The second spectral wavelength range is composed of greater wavelengths than the wavelengths of the first spectral wavelength range.

15 Claims, 5 Drawing Sheets

MULTIJUNCTION SOLAR CELLS HAVING A GRADED-INDEX REFLECTOR STRUCTURE

REFERENCE TO RELATED APPLICATIONS

This application is a continuation of U.S. patent application Ser. No. 15/495,524 filed Apr. 24, 2017, which claims the benefit of U.S. Provisional Application No. 62/391,752, filed May 11, 2016, which is herein incorporated by reference in its entirety.

BACKGROUND OF THE INVENTION

1. Field of the Invention

The present disclosure relates to solar cells and the fabrication of solar cells, and more particularly to multijunction solar cells having at least one graded-index reflector structure.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided by the photovoltaic power system. Thus, as payloads become more sophisticated, weight or mass of the photovoltaic power system, and more particularly the power-to-weight ratio of the solar cells becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum by the subcells in a multijunction solar cell. As such, the characteristic of sunlight absorption in semiconductor material, also known as photovoltaic properties, is critical to determine the most efficient number and sequence of subcells, and the semiconductor material (with specific bandgap, thickness, and electrical properties) in each subcell, to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The present disclosure proposes additional design features for multijunction solar cells capable of increasing the efficiency of the multijunction solar cell in converting solar energy (or photons) to electrical energy.

SUMMARY OF THE INVENTION

Briefly, and in general terms, the present disclosure provides a multijunction solar cell comprising: an upper solar subcell having an emitter layer and a base layer forming a photoelectric junction; a first graded-index reflector structure disposed beneath the base layer of the upper solar subcell; wherein the first graded-index reflector structure is composed of a plurality of alternating layers of different semiconductor materials having different indices of refraction; wherein the difference in the indices of refraction between adjacent layers varies throughout the thickness of the first graded-index reflector structure; and a lower solar subcell disposed beneath the first graded-index reflector structure; wherein the lower solar subcell has an emitter layer and a base layer forming a photoelectric junction; wherein the first graded-index reflector structure is constructed such that (i) at least a portion of light of a first spectral wavelength range that enters and passes through the upper solar subcell is reflected back into the upper solar subcell by the first graded-index reflector structure; and (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range.

In another embodiment, the present disclosure provides a multijunction solar cell comprising: an upper solar subcell having an emitter layer and a base layer forming a photoelectric junction; a first graded-index reflector structure disposed beneath the base layer of the upper solar subcell, wherein the first graded-index reflector structure is composed of a plurality of alternating layers of different semiconductor materials having different indices of refraction; wherein the difference in the indices of refraction between adjacent layers varies throughout the thickness of the first graded-index reflector structure; wherein for a first set of adjacent layers, the difference in the indices of refraction between adjacent layers increases as the distance between the adjacent layers and the upper solar subcell increases; wherein for a second set of adjacent layers, the difference in the indices of refraction between adjacent layers decreases as the distance between the adjacent layers and the upper solar subcell increases, and wherein the first set of adjacent layers is spaced apart from the second set of adjacent layers; and a lower solar subcell disposed beneath the first graded-index reflector structure, wherein the lower solar subcell has an emitter layer and a base layer forming a photoelectric junction; wherein the first graded-index reflector structure is constructed such that (i) at least a portion of light of a first spectral wavelength range that enters and passes through the upper solar subcell is reflected back into the upper solar subcell by the first graded-index reflector structure; and (ii) at least a portion of light of a second spectral wavelength range that enters and passes through the upper solar subcell is transmitted through the first graded-index reflector structure to layers disposed beneath the first graded-index reflector structure; wherein the second spectral wavelength range is composed of greater wavelengths than the wavelengths of the first spectral wavelength range.

In still another embodiment, the present disclosure provides a multijunction solar cell comprising: an upper solar subcell having an emitter layer and a base layer forming a photoelectric junction; a first graded-index reflector structure disposed beneath the base layer of the upper solar subcell; wherein the first graded-index reflector structure is composed of a plurality of alternating layers of different semiconductor materials having different indices of refraction; wherein the difference in the indices of refraction between adjacent layers varies throughout the thickness of the first graded-index reflector structure; wherein for a first set of adjacent layers, the difference in the indices of refraction between adjacent layers increases as the distance between the adjacent layers and the upper solar subcell increases; wherein for a second set of adjacent layers, the difference in the indices of refraction between adjacent layers remains constant as the distance between the adjacent layers and the upper solar subcell increases; and a lower solar subcell disposed beneath the first graded-index reflector structure, wherein the lower solar subcell has an emitter layer and a base layer forming a photoelectric junction; wherein the first graded-index reflector structure is constructed such that (i) at least a portion of light of a first spectral wavelength range that enters and passes through the upper solar subcell is reflected back into the upper solar subcell by the first graded-index reflector structure; and (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range. In some embodiments, the first graded-index reflector structure further comprises a third set of adjacent layers; wherein the difference in the indices of refraction between adjacent layers in the third set of adjacent layers decreases as the distance between the adjacent layers and the upper solar subcell increases.

In some embodiments, the above disclosed multijunction solar cells optionally further comprise one or more additional graded index reflector layer structures disposed beneath one or more additional subcells.

For example, in some embodiments, the above disclosed multijunction solar cells optionally further comprise a second graded-index reflector structure disposed beneath the base layer of the lower solar subcell; wherein the second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

In some embodiments, the above-disclosed multijunction solar cells are upright multijunction solar cells.

In some embodiments, the above-disclosed multijunction solar cells are upright metamorphic multijunction solar cells.

In some embodiments, the above-disclosed multijunction solar cells are inverted metamorphic multijunction solar cells.

In some embodiments, the above-disclosed multijunction solar cells are III-V compound semiconductor multijunction solar cells.

In certain embodiments, the multijunction solar cells having one or more graded-index reflector structure can provide advantages over multijunction solar cells having one or more Distributed Bragg Reflector (DBR) layers. For example, by reducing or eliminating side lobe reflectivity encountered with DRB layers. The reduction or elimination of side lobe reflectivity with the graded-index reflector structure can allow for the practical and efficient design of multijunction solar cells having below one subcell, two subcells, three subcells, or even all subcells of the multijunction solar cell.

BRIEF DESCRIPTION OF THE DRAWING

The invention will be better and more fully appreciated by reference to the following detailed description when considered in conjunction with the accompanying drawings, wherein.

DESCRIPTION OF ILLUSTRATIVE EMBODIMENTS

A Distributed Bragg Reflector (or DBR) is a specially formulated sequence of thin film layers that offers a high degree of reflectance over a specific wavelength range. The central wavelength in free space (air), $\lambda_{central}$, of the reflectivity band can be adjusted by employing two or more materials that have a difference in their optical index of refraction. The reflector may be realized by placing repeating alternating pairs of each material. The thickness of each layer is ¼ of the central wavelength inside the material, or $t=\lambda_{central}/\{4n_{central}\}$, where t is the layer thickness and $n(\lambda_{central})$ is the index of refraction of the layer at the central wavelength.

DBR reflectivity is calculated from Maxwell's equations via the transfer matrix method. It can also be approximated by the following equation:

$$R = \left[\frac{n_o(n_2)^{2N} - n_s(n_1)^{2N}}{n_o(n_2)^{2N} + n_s(n_1)^{2N}}\right]^2,$$

where $n_{0,1,2,s}$ are the refractive indices of the originating material, the two alternating materials, and the substrate material; and N is the number of repeated pairs. The frequency bandwidth, $\Delta f_o$, of the reflection band can be approximated by:

$$\frac{\Delta f_0}{f_0} = \frac{4}{\pi}\arcsin\left(\frac{n_2 - n_1}{n_2 + n_1}\right),$$

where $f_o$ is the central frequency of the band. Adding and subtracting $\Delta f_o$ from $f_o$ and converting the two frequencies into wavelength via $c=f\lambda$, one arrives at approximate bandwidth of reflector in free space.

Figure 1:
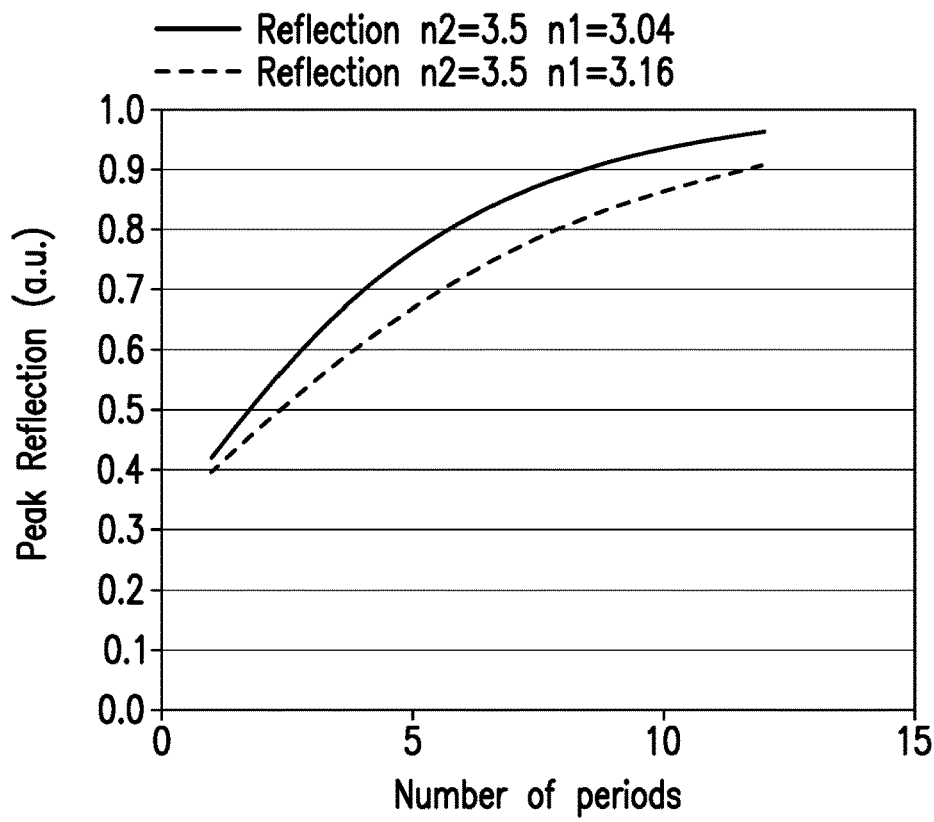
FIG. 1 is a graphical illustration of peak reflection vs. number of periods for exemplary DBRs with alternating layers having (i) a larger index of refraction difference (solid line), and (ii) a smaller index of refraction difference (dashed line).
Figure 2:
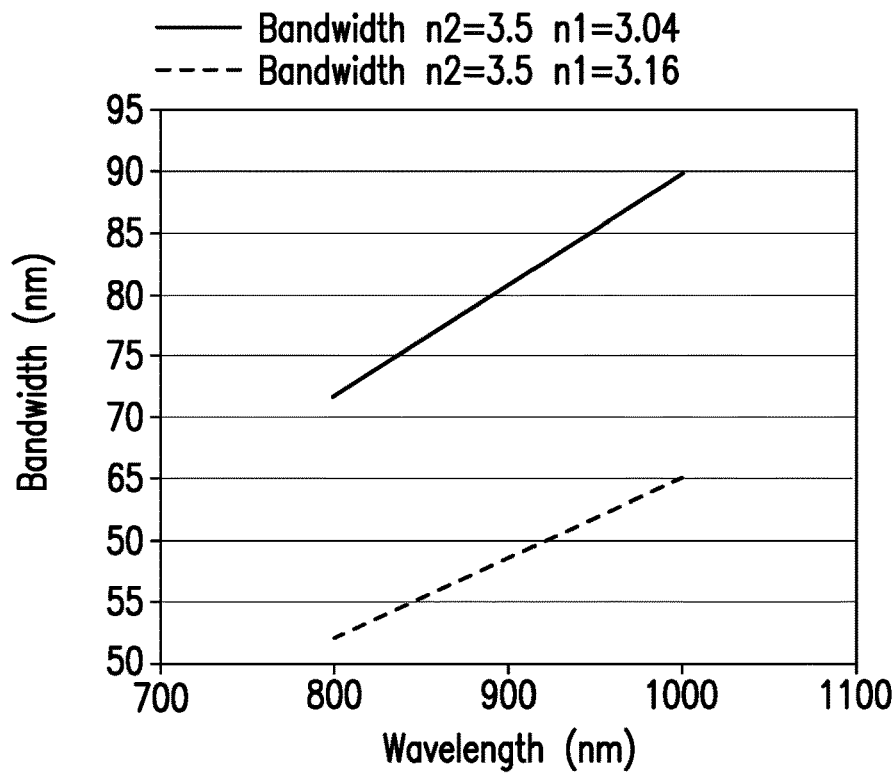
FIG. 2 is a graphical illustration of approximate bandwidth of the reflector for exemplary DBRs with alternating layers having (i) a larger index of refraction difference (solid line), and (ii) a smaller index of refraction difference (dashed line).

FIG. 1 is a graphical illustration of peak reflection vs. number of periods for exemplary DBRs with alternating layers having (i) a larger index of refraction difference (solid line), and (ii) a smaller index of refraction difference (dashed line). FIG. 2 is a graphical illustration of approximate bandwidth of the reflector for exemplary DBRs with alternating layers having (i) a larger index of refraction difference (solid line), and (ii) a smaller index of refraction difference (dashed line).

Increasing the number of pairs in a DBR increases the mirror reflectivity as illustrated in FIG. 1, while increasing the refractive index contrast between the materials in the Bragg pairs increases both the reflectivity (at a given number of periods) and the bandwidth as illustrated in FIG. 1 and FIG. 2. Stated otherwise, a higher index of refraction change may require fewer alternating pairs to reach a high reflectivity and may produce a broader bandwidth, which may be precisely what is desired for economical incorporation into a multijunction solar cell. For fiber optics, the desired bandwidth is extremely narrow so a very small index of refraction change may be preferable, and thus, hundreds of alternating pairs may be used to reach a high degree of reflectivity.

Figure 3:
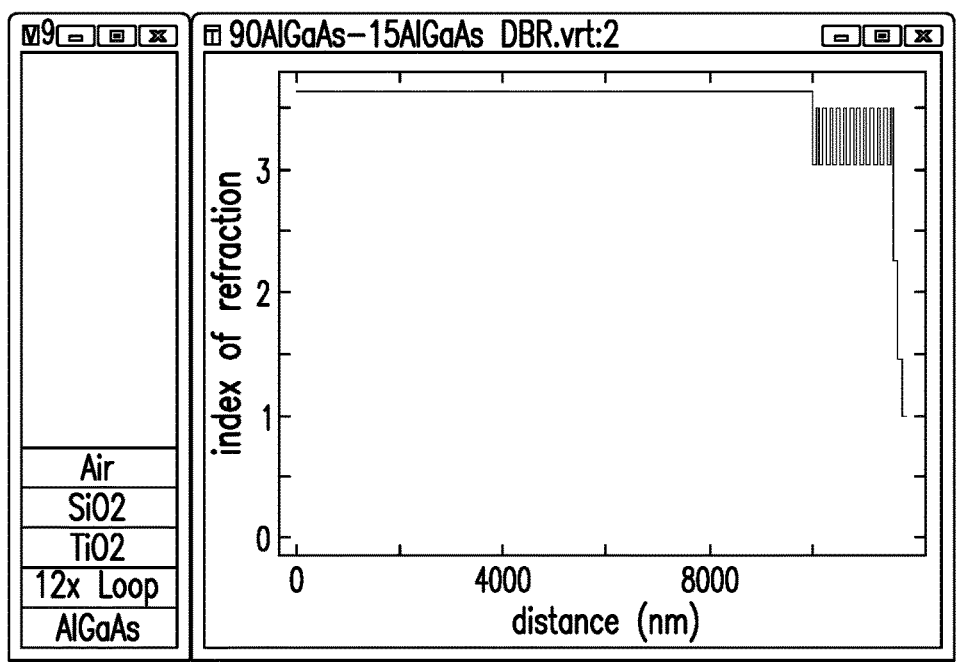
FIG. 3 illustrates the structure of a simulated DBR on the left, and the index of refraction change as a function of depth from the rear of the device. The oscillating layers near the front of the device represent the DBR pairs.

When the transfer matrix method is used to calculate the DBR reflectance as a function of wavelength, a more accurate result may be obtained when dispersive material properties are used (i.e., index of refraction and absorption coefficient as a function of wavelength). Simulated results from the computer program VERTICAL (developed at Sandia National Laboratories for VCSELS, 1996) are illustrated in FIG. 3. FIG. 3 illustrates the structure of a simulated DBR on the left, and the index of refraction change as a function of depth from the rear of the device. The oscillating layers near the front of the device represent the DBR pairs.

The central wavelength of the DBR is designed to be 800 nm in the example. The substrate is GaAs (mole fraction of aluminum=0) and the DBR has 12 periods of $Al_{0.9}Ga_{0.1}As/Al_{0.15}Ga_{0.85}As$. In some embodiments, the $Al_{0.9}Ga_{0.1}As$ is deposited on the substrate first with an index of refraction n=3.04 and thickness t=67.1 nm. The $Al_{0.15}Ga_{0.85}As$ follows, which may have an index of refraction n=3.51 and thickness t=57.8 nm. The pair may be repeated 12 times and be coated with a standard dual layer antireflection coating consisting of $TiO_2$ t=60 nm and $SiO_2$ t=100 nm.

Figure 4:
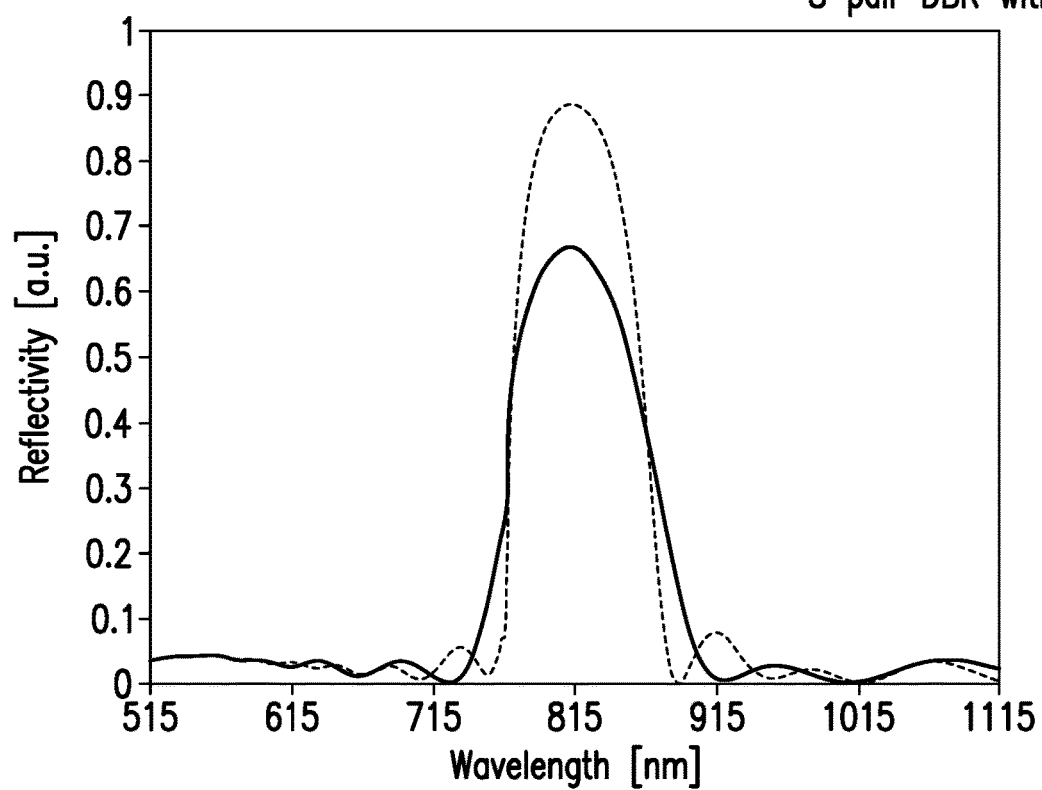
FIG. 4 is a plot illustrating simulated reflectance for DBRs with 12 pairs of alternating layers (dashed line) and 8 pairs of alternating layers (solid line) of $Al_{0.9}Ga_{0.1}As/Al_{0.15}Ga_{0.85}As$, centered at 815 nm.

The resulting reflectivity of the structure above is shown in FIG. 4 for both 12 pairs and 8 pairs of alternating layers. FIG. 4 is a plot illustrating simulated reflectance for DBRs with 12 pairs of alternating layers (dashed line) and 8 pairs of alternating layers (solid line) of $Al_{0.9}Ga_{0.1}As/Al_{0.15}Ga_{0.85}As$, centered at 815 nm. One can see that by increasing the number of pairs, the peak reflectance increases. In addition, the full width half maximum of the reflection band is approximately 100 nm, broadening slightly for the 8-pair device.

Figure 5:
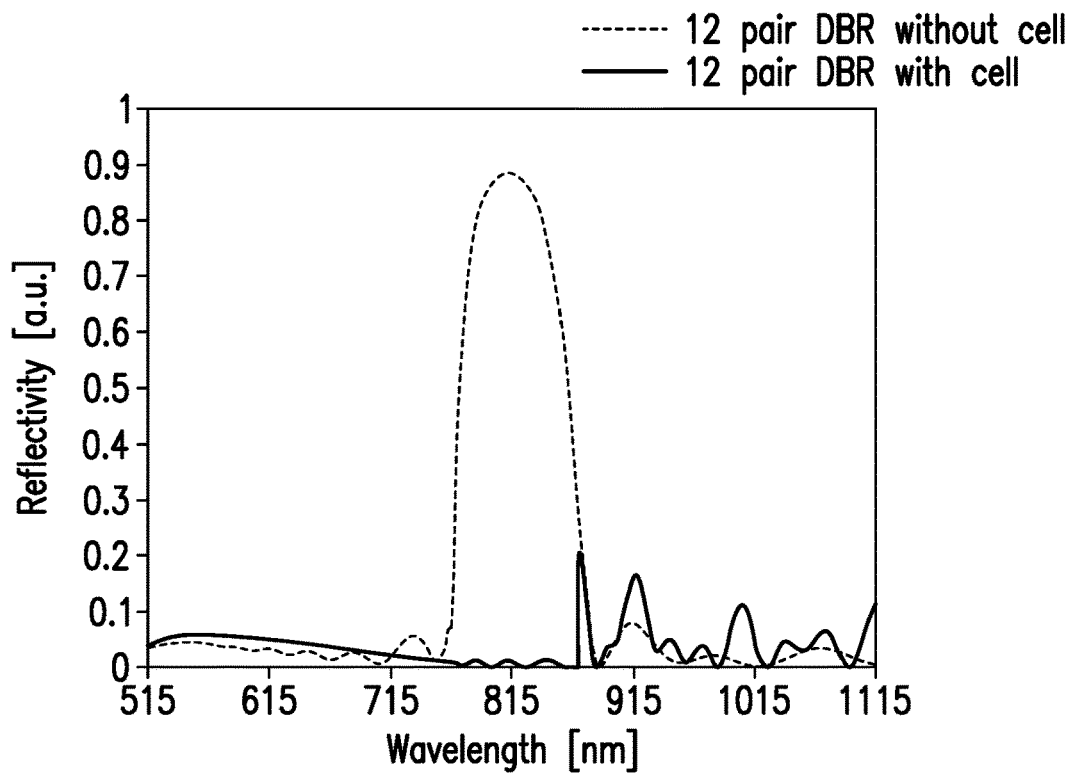
FIG. 5 is a plot illustrating the simulated reflectance for a DBR with 12 pairs of alternating layers of $Al_{0.9}Ga_{0.1}As/Al_{0.15}Ga_{0.85}As$ both without (dashed line) and with (solid line) an overlying 2500 nm thick layer of GaAs that absorbs the majority of incoming light up to 870 nm.

If a thick semiconductor layer is deposited above the DBR, most of the incident light may be absorbed up to the bandgap energy of the layer. In some embodiments, any light that is not absorbed by the material will reflect off the DBR, effectively doubling the optical thickness of the semiconductor layer over the wavelength region where the DBR reflectance is near unity. FIG. 5 is a plot illustrating the simulated reflectance for a DBR with 12 pairs of alternating layers of $Al_{0.9}Ga_{0.1}As/Al_{0.15}Ga_{0.85}As$ both without (dashed line) and with (solid line) an overlying 2500 nm thick layer of GaAs that absorbs the majority of incoming light up to 870 nm. The plot shows that only the remnants of the DBR side lobes are visible above 870 nm.

The numerous reflectance peaks above 870 nm result in a lower transmission of light into the material below the DBR stack. In the case of a triple junction solar cell, where the DBR is deposited beneath the $2^{nd}$ (In)GaAs subcell, the $3^{rd}$ Ge subcell may not be greatly affected by the resulting light loss since it has an approximately 40% excess in photocurrent. Nevertheless, reducing the side lobe reflection peaks may increase the photocurrent of the Ge subcell and improve the triple junction FF and device performance slightly.

In designs that require a high degree of current matching in all subcells, the resulting side lobe reflection losses may be so problematic that any performance gain made at EOL by the employment of a DBR may be lost by the reduced current in the subcell below. Thus, it is clear that there is a need for an internal reflector that offers the performance of a traditional DBR but does not result in excessive side lobe losses.

Disclosed herein are multijunction solar cells that include a graded-index reflector structure. Compared to a DBR, it has been found that graded-index reflector structures can reduce or eliminate side lobe reflectivity. Thus, graded-index reflector structures are sometimes referred to as apodized reflectors.

Apodized or graded-index reflector structures are sometimes used in the fiber optics industry. In this reflector design, instead of having repeating pairs of high and low index materials, the index of refraction difference is gradually increased as the number of periods increase. Then, one or more periods of the maximum index difference pairs are layered, followed by a gradual decrease in the index of refraction difference.

Figure 6:
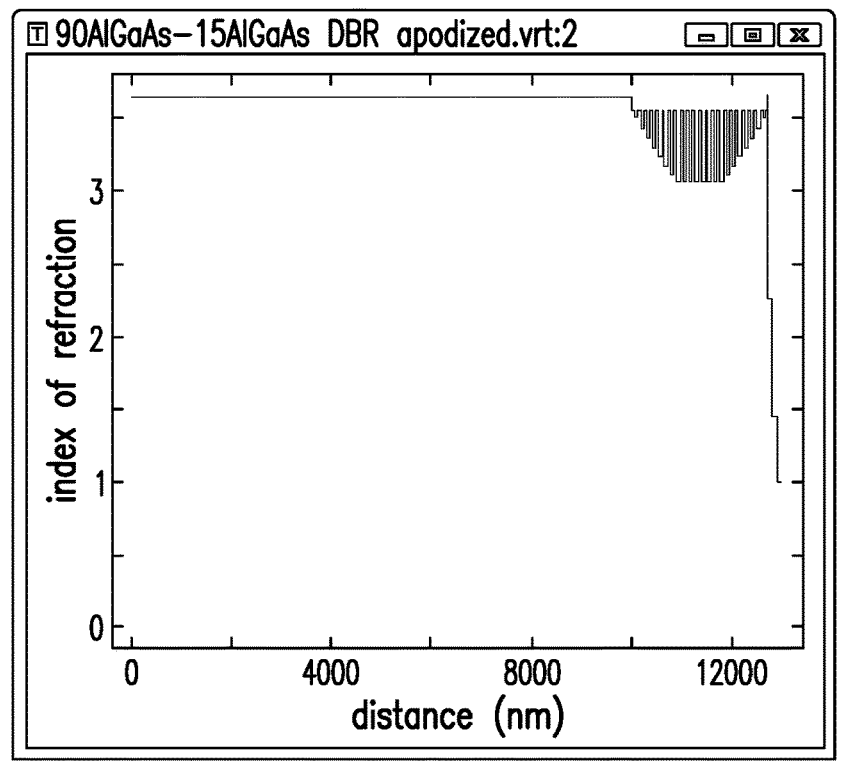
FIG. 6 is an index of refraction profile for a graded-index reflector structure with 20 pairs of alternating layers of $Al_xGa_{(1-x)}As/Al_{15}Ga_{85}As$, wherein 0<x<1, and x is gradually increased and decreased on each side of the center 6 pairs of $Al_{0.9}Ga_{0.1}As/Al_{0.15}Ga_{0.85}As$.

FIG. 6 is an index of refraction profile for a graded-index reflector structure with 20 pairs of alternating layers of $Al_xGa_{(1-x)}As/Al_{.15}Ga_{.85}As$, wherein $0<x<1$, and x is gradually increased and decreased on each side of the center 6 pairs of $Al_{0.9}Ga_{0.1}As/Al_{0.15}Ga_{0.85}As$.

Figure 7:
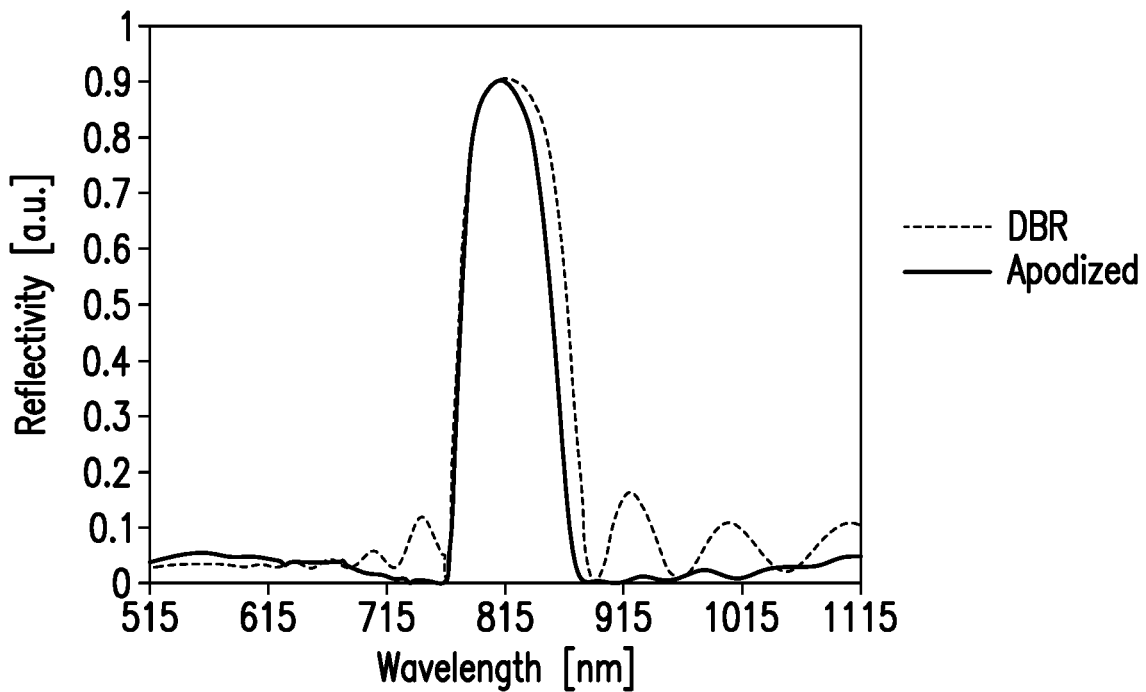
FIG. 7 is a plot of the simulated reflectance for a DBR with 12 pairs of alternating layers of $Al_{0.9}Ga_{0.1}As/Al_{0.15}Ga_{0.85}As$ (solid line) compared with a graded-index reflector structure with 20 pairs of alternating layers of $Al_xGa_{(1-x)}As/Al_{0.15}Ga_{0.85}As$, wherein $0<x<1$, and x is gradually increased and decreased by 10% for each pair on both sides of the center 6 pairs of alternating layers of $Al_{0.9}Ga_{0.1}As/Al_{0.15}Ga_{0.85}As$ (dashed line).

In FIG. 7, a 20-pair graded-index reflector structure is compared to a 12-pair traditional DBR. FIG. 7 is a plot of the simulated reflectance for a DBR with 12 pairs of alternating layers of $Al_{0.9}Ga_{0.1}As/Al_{0.15}Ga_{0.85}As$ (solid line) compared with a graded-index reflector structure with 20 pairs of alternating layers of $Al_xGa_{(1-x)}As/Al_{0.15}Ga_{0.85}As$, wherein $0<x<1$, and x is gradually increased and decreased by 10% for each pair on both sides of the center 6 pairs of alternating layers of $Al_{0.9}Ga_{0.1}As/Al_{0.15}Ga_{0.85}As$ (dashed line). The mole fraction of aluminum of the lower index $Al_{0.2}Ga_{0.8}As$ is increased by 10% for each pair from $Al_{0.2}Ga_{0.8}As/Al_{0.15}Ga_{0.85}As$ to $Al_{0.9}Ga_{0.1}As/Al_{0.15}Ga_{0.85}As$. Then, 5 pairs of $Al_{0.9}Ga_{0.1}As/Al_{0.15}Ga_{0.85}As$ are repeated to increase the maximum reflectivity value. Finally, the mole fraction of aluminum is decreased by 10% for each pair as before to result in the graded-index profile. In some embodiments, the result is a reflectivity profile that has the same peak as the 12-period DBR, a slightly narrower bandwidth, and most importantly, no side lobes in the infrared above 870 nm.

Figure 8:
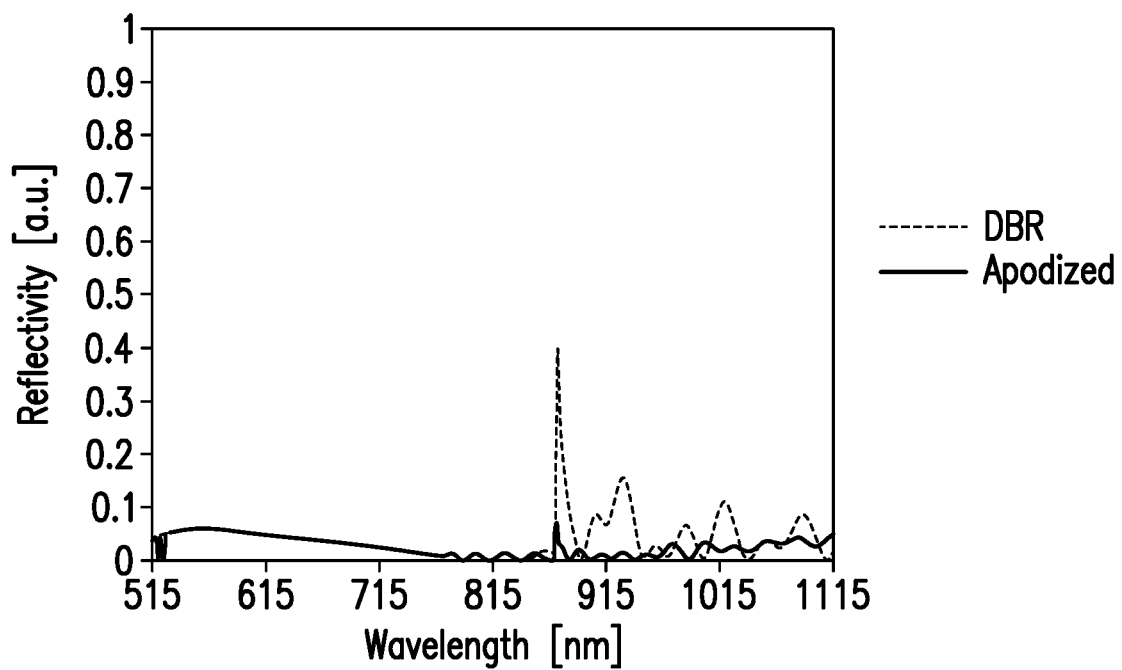
FIG. 8 is a plot of the simulated reflectance for the DBR (dashed line) and the graded-index reflector structures (solid line) of FIG. 7 after an absorbing 2500 nm thick GaAs cell is deposited above the reflective layers. Note the large reduction in side lobe reflection losses.

If a thick semiconductor layer is deposited above the reflector structure, most of the incident light may be absorbed up to the bandgap energy of the layer. In some embodiments, any light that is not absorbed by the material will reflect off the reflector structure, effectively doubling the optical thickness of the semiconductor layer over the wavelength region where the graded-index reflectance is near unity. FIG. 8 is a plot of the simulated reflectance for the DBR (dashed line) and the graded-index reflector structures (solid line) of FIG. 7 after an absorbing 2500 nm thick GaAs cell is deposited above the reflective layers. Note the large reduction in side lobe reflection losses. Note the large reduction in side lobe reflection losses. The plot shows that only the remnants of the DBR side lobes are visible above 870 nm.

The lack of side lobes opens up the opportunity to use internal reflectors under multiple subcells, or even every subcell, in a multijunction solar cell.

Figure 9:
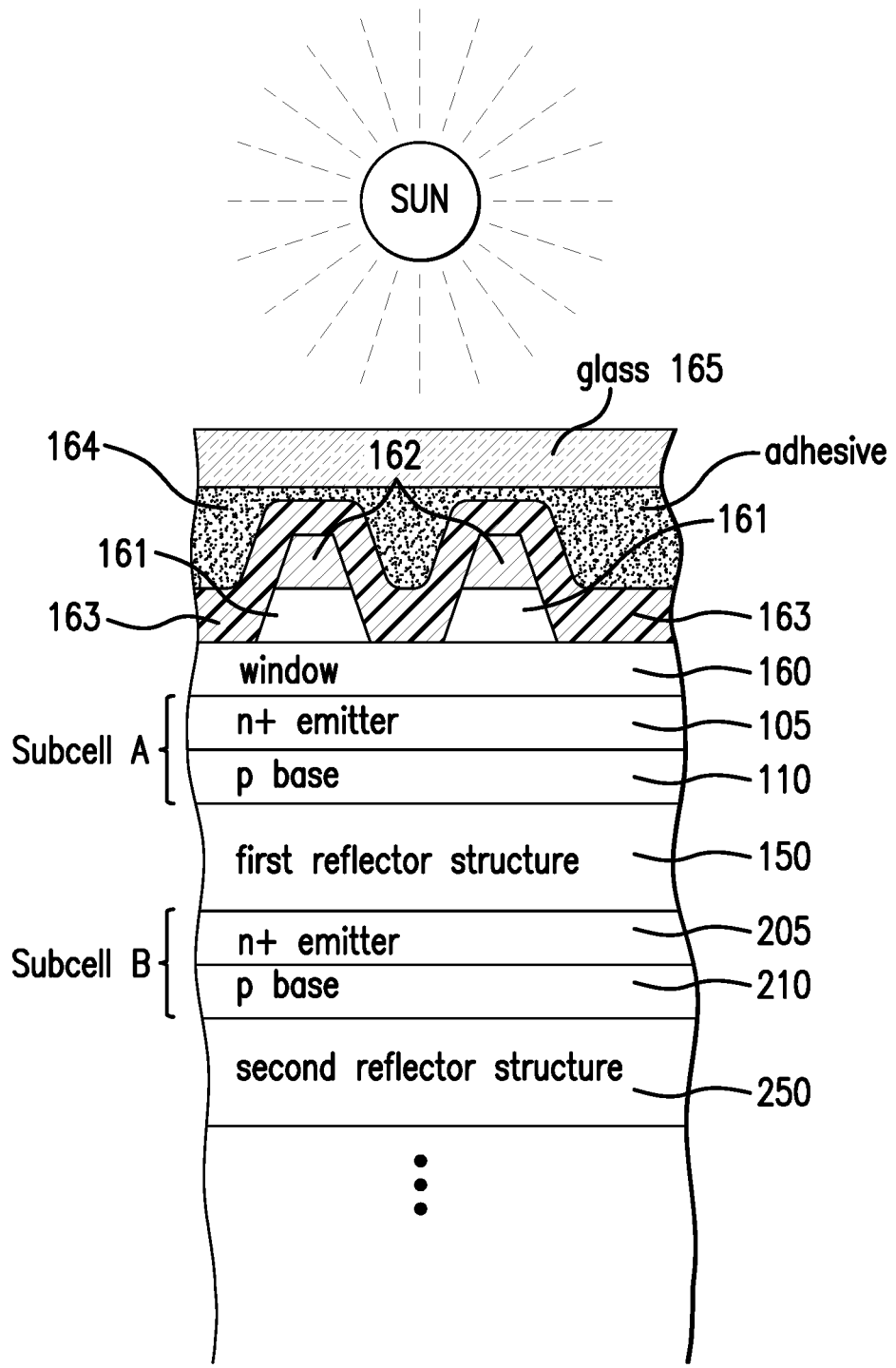
FIG. 9 is a schematic representation of an exemplary multijunction solar cell having a graded-index reflector structure.

An exemplary multijunction solar cell is illustrated in FIG. 9. It should be understood that the multijunction solar cell can include additional layers above, below, or in between the illustrated layers, and that such additional layers have not been illustrated in FIG. 9 for simplicity and clarity.

As illustrated in FIG. 9, light enters the multijunction solar cell through the top. The multijunction solar cell includes upper solar subcell A composed of emitter layer 105 and base layer 110. Upper solar subcell A can include a wide variety of suitable solar subcells such as silicon subcells or III-V compound semiconductor solar subcells.

A first graded-index reflector structure 150 as described herein is disposed beneath base layer 110 of upper solar subcell A.

Lower solar subcell B composed of emitter layer 205 and base layer 210 is disposed beneath the first graded-index reflector structure 150. Lower solar subcell B can be composed of the same materials or different materials than upper solar subcell A. Lower solar subcell B can include a wide variety of suitable solar subcells such as silicon subcells or III-V compound semiconductor solar subcells.

In some embodiments, the multijunction solar cell can optionally include a second graded-index reflector structure 250 as described herein disposed beneath base layer 210 of lower solar subcell B.

Although not illustrated in FIG. 9, the multijunction solar cell can optionally include one, two, three, or even more additional subcells. In certain embodiments, some or all of the solar subcells are epitaxially grown subcells. In some embodiments, some or all of the solar subcells are bonded subcells.

As illustrated in FIG. 9, in some embodiments the multijunction solar cell further includes window layer 160 disposed on the upper surface of subcell A. Grid lines 162 can be deposited via evaporation and lithographically patterned over contact layer 161, which is disposed on window layer 160. As illustrated in FIG. 9, contact layer 161 has also been etched to the surface of window layer 160 using grid lines 162 as masks. Antireflective (ARC) dielectric coating layer 163 is disposed over the entire surface of the upper surface of subcell A including grid lines 162. As illustrated in FIG. 9, cover glass 165 is attached to the upper surface of the multijunction solar cell by adhesive 164.

In some embodiments, the multijunction solar cell is an upright multijunction solar cell. In some embodiments, the multijunction solar cell is an upright metamorphic multijunction solar cell. In some embodiments, multijunction solar cell is an inverted metamorphic solar cell.

There can be practical reasons for not including graded-index reflector structures below high bandgap subcells. In some embodiments, a properly designed reflector may be comprised of materials that have slightly higher bandgap energy than the material above. For example, for an upper (In)GaAs subcell with bandgap energy 1.41 eV, a $Al_{0.15}Ga_{0.85}As$ layer with a bandgap energy of 1.61 eV as the lowest bandgap material in the reflector may be used. Otherwise, the reflector may absorb the incident light that is desired to be reflected. In some embodiments, for high bandgap materials like InGaP at 1.9 eV, materials are 2.0 eV and higher. In the III-V material system lattice matched to GaAs, bandgap energies only go up to approximately 2.3 eV. In some embodiments, the graded-index reflector structure could be made from AlInGaP and InAlP. However, the change in index of refraction could be only 0.2 between the two materials, making both the bandwidth narrow and the required number of pairs high.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

The invention claimed is:

1. A multijunction solar cell comprising:
   an upper solar subcell having an emitter layer and a base layer forming a photoelectric junction;
   a first graded-index reflector structure disposed beneath the base layer of the upper solar subcell; wherein the first graded-index reflector structure comprises a first plurality of pairs of alternating layers of $Al_xGa_{(1-x)}As$ and a different semiconductor material, wherein $0<x<1$ and a mole fraction of aluminum is increased for each of the $Al_xGa_{(1-x)}As$ layers in the first plurality of pairs of alternating layers as the distance between the alternating layers and the upper solar subcell increases; and
   a lower solar subcell disposed beneath the first graded-index reflector structure; wherein the lower solar subcell has an emitter layer and a base layer forming a photoelectric junction;
   wherein the first graded-index reflector structure is constructed such that (i) at least a portion of light of a first spectral wavelength range that enters and passes through the upper solar subcell is reflected back into the upper solar subcell by the first graded-index reflector structure; (ii) at least a portion of light of a second spectral wavelength range that enters and passes through the upper solar subcell is transmitted through the first graded-index reflector structure to layers disposed beneath the first graded-index reflector structure, wherein the second spectral wavelength range is composed of greater wavelengths than the wavelengths of the first spectral wavelength range.

2. The multijunction solar cell of claim 1 further comprising a second graded-index reflector structure disposed beneath the base layer of the lower solar subcell;
   wherein the second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

3. The multijunction solar cell of claim 1, wherein the different semiconductor material is $Al_{0.15}Ga_{0.85}As$.

4. The multijunction solar cell of claim 1, wherein the upper subcell is composed (In)GaAs with a band gap of 1.41 eV, and the reflector structure includes a layer of $Al_{0.15}Ga_{0.85}As$ with a band gap of 1.61 eV.

5. The multijunction solar cell of claim 1, wherein the multijunction solar cell is an upright multijunction solar cell, or an upright metamorphic solar cell, or an inverted metamorphic multijunction solar cell.

6. The multijunction solar cell of claim 1, wherein the multijunction solar cell is a III-V compound semiconductor multijunction solar cell and wherein the increase in mole fraction of aluminum in the $Al_xGa_{(1-x)}As$ layer in the first plurality of pairs of alternating layers ranges from $Al_{0.2}Ga_{0.8}As$ to $Al_{0.9}Ga_{0.1}As$.

7. The multijunction solar cell of claim 1, wherein the first graded-index reflector structure further comprises:
   a second plurality of pairs of alternating layers of $Al_xGa_{(1-x)}As$ and the different semiconductor material wherein a mole fraction of aluminum for each of the $Al_xGa_{(1-x)}As$ layers in the second plurality of pairs of alternating layers is repeated; and
   a third plurality of pairs of alternating layers of $Al_xGa_{(1-x)}As$ and the different semiconductor material wherein a mole fraction of aluminum for each of the $Al_xGa_{(1-x)}As$ layers is decreased in the third plurality of pairs of alternating layers as the distance between the alternating layers in the third plurality of pairs of alternating layers and the upper solar subcell increases.

8. The multijunction solar cell of claim 7, wherein the first plurality of pairs of alternating layers comprises $Al_xGa_{(1-x)}As/Al_{0.15}Ga_{0.85}As$, wherein x is gradually increased from 0.2 to 0.9, such that the alternating pairs of $Al_xGa_{(1-x)}As/Al_{0.15}Ga_{0.85}As$ increase from $Al_{0.2}Ga_{0.8}As/Al_{0.15}Ga_{0.85}As$ up to $Al_{0.9}Ga_{0.1}As/Al_{0.15}Ga_{0.85}As$, the second plurality of pairs of alternating layers comprises $Al_{0.9}Ga_{0.1}As/Al_{0.15}Ga_{0.85}As$ wherein x remains constant, and the third plurality of pairs of alternating layers comprises $Al_xGa_{(1-x)}As/Al_{0.15}Ga_{0.85}As$ wherein x is gradually decreased from 0.9 to 0.2, such that the alternating pairs of $Al_xGa_{(1-x)}As/Al_{0.15}Ga_{0.85}As$ decrease from $Al_{0.9}Ga_{0.1}As/Al_{0.15}Ga_{0.85}As$ down to $Al_{0.2}Ga_{0.8}As/Al_{0.15}Ga_{0.85}As$.

9. The multijunction solar cell of claim 8, wherein the upper subcell is (In)GaAs with a band gap of 1.41 eV, and a $Al_{0.15}Ga_{0.85}As$ layer with a bandgap energy of 1.61 eV as the lowest band gap material in the first graded-index reflector structure, and the multijunction solar cell is an upright multijunction solar cell.

10. The multijunction solar cell of claim 1, wherein the reflector structure has a central wavelength primary reflectance peak and a substantial reduction in side lobe peaks which would result in reflection losses around the wavelength of such side lobe peaks.

11. A multijunction solar cell comprising:
    an upper solar subcell having an emitter layer and a base layer forming a photoelectric junction;
    a first graded-index reflector structure disposed beneath the base layer of the upper solar subcell, wherein the first graded-index reflector structure comprises a plurality of pairs of alternating layers of $Al_xGa_{(1-x)}As$ and a different semiconductor material, wherein $0<x<1$;
    wherein for a first plurality of pairs of alternating layers, the difference in the indices of refraction between alternating layers increases as the distance between the alternating layers and the upper solar subcell increases;
    wherein for a second plurality of pairs of alternating layers, the difference in the indices of refraction between alternating layers decreases as the distance between the alternating layers and the upper solar subcell increases, and
    wherein the first plurality of pairs of alternating layers is spaced apart from the second plurality of pairs of alternating layers by a plurality of central alternating layers wherein the difference in the indices of refraction between central alternating layers remains constant; and a lower solar subcell disposed beneath the first graded-index reflector structure, wherein the lower solar subcell has an emitter layer and a base layer forming a photoelectric junction;

wherein the first graded-index reflector structure is constructed such that (i) at least a portion of light of a first spectral wavelength range that enters and passes through the upper solar subcell is reflected back into the upper solar subcell by the first graded-index reflector structure; and (ii) at least a portion of light of a second spectral wavelength range that enters and passes through the upper solar subcell is transmitted through the first graded-index reflector structure to layers disposed beneath the first graded-index reflector structure; wherein the second spectral wavelength range is composed of greater wavelengths than the wavelengths of the first spectral wavelength range.

12. The multijunction solar cell of claim 11, further comprising a second graded-index reflector structure disposed beneath the base layer of the lower solar subcell;

wherein the second graded-index reflector structure is constructed such that (i) at least a portion of light of a first spectral wavelength range that enters and passes through the lower solar subcell is reflected back into the lower solar subcell by the second graded-index reflector structure; and (ii) at least a portion of light of a second spectral wavelength range that enters and passes through the lower solar subcell is transmitted through the second graded-index reflector structure to layers disposed beneath the second graded-index reflector structure, wherein the second spectral wavelength range is composed of greater wavelengths than the wavelengths of the first spectral wavelength range.

13. The multijunction solar cell of claim 11, wherein the different semiconductor material is $Al_{0.15}Ga_{0.85}As$.

14. The multijunction solar cell of claim 11, wherein the upper subcell is (In)GaAs with a band gap of 1.41 eV, and the reflector structure includes a layer of $Al_{0.15}Ga_{0.85}As$ with a band gap of 1.61 eV.

15. The multijunction solar cell of claim 11, wherein the multijunction solar cell is an upright multijunction solar cell, an upright metamorphic multijunction solar cell, or an inverted metamorphic multijunction solar cell.

* * * * *